United States Patent [19]
Berkstresser et al.

[11] Patent Number: 5,164,041
[45] Date of Patent: Nov. 17, 1992

[54] METHOD OF GROWING RARE EARTH DOPED ORTHOSILICATES(LN2-XREXSIO5)

[75] Inventors: George W. Berkstresser, Bridgewater; Charles D. Brandle, Jr., Basking Ridge, both of N.J.

[73] Assignee: AT&T Bell Laboratories, Murray Hill, N.J.

[21] Appl. No.: 637,846

[22] Filed: Jan. 4, 1991

[51] Int. Cl.$^5$ ............................................. C30B 15/00
[52] U.S. Cl. ........................... 156/617; 156/DIG. 63; 156/DIG. 64; 156/DIG. 80
[58] Field of Search ..................... 156/617.1, DIG. 63, 156/DIG. 64, DIG. 80

[56] References Cited

U.S. PATENT DOCUMENTS

| | | | |
|---|---|---|---|
| 4,315,832 | 2/1982 | Pastor et al. | 156/DIG. 63 |
| 4,853,354 | 1/1989 | Calvat et al. | 156/DIG. 63 |
| 4,902,654 | 2/1990 | Aubert et al. | 156/DIG. 63 |
| 4,944,833 | 7/1990 | Belt et al. | 156/617.1 |
| 4,954,211 | 9/1990 | Belt et al. | 156/617.1 |

OTHER PUBLICATIONS

"Laser Properties of $Y_2SiO_5$-$Nd^{3+}$ Crystals Irradiated at the $^4F_{3/2}$-$^4I_{11/2}$ and $^4F_{3/2}$-$^4I_{13/2}$ Transitions" Kh. S. Bagdasarov et al., Sov. Phys. Dokl., vol. 18, No. 10, Apr. 1974, p. 664.

"Luminescence and Stimulated Emission of Holmium in Yttrium— and Erbium— Oxyortho-Silicate Single Crystals", A. M. Morozov et al., Opt. Spectrosc., vol. 41, No. 6, Dec. 1976, pp. 641-642.

"$Nd^{3+}$ Optical Centers in Lutecium, Yttrium, and Scandium Silicate Crystals and Their Spontaneous and Stimulated Emission", A. M. Tkachuk et al. Opt. Spectrosc. (USSR) 60 (2), Feb. 1986, pp. 176-181.

"A Ground State Depleted Laser in Neodymium Doped Yttrium Orthosilicate," R. Beach et al., presented at SPIE OE LASE '90, Jan. 16, 1990.

"The Growth of Single Crystals", R. A. Laudise pp. 174-199, Prentice-Hall, Inc.

"Czochralski Growth of Rare-Earth Orthosilicates" ($Ln_2SiO_5$), C. D. Brandle et al. Journal of Crystal Growth 79 (1986) pp. 308-315.

Primary Examiner—Robert Kunemund
Assistant Examiner—FeLisa Garrett
Attorney, Agent, or Firm—Oleg E. Alber

[57] ABSTRACT

The invention is a technique for the growth of single crystals of rare earth doped rare-earth orthosilicate crystals which may be used as the laser medium in solid-state non-semiconductor lasers. This type of laser has applications in electronics, communications, aerospace systems, and manufacturing technology where high optical output lasers are utilized. Of particular interest is the $Y_{2-x}Nd_xSiO_5$ crystal, with x being up to 0.3, which may be efficiently pumped by a semiconductor laser, solid state non-semiconductor laser, a flashlamp or some other source of light radiation, and has been found to be operable at very high optical output. The rare-earth orthosilicate crystals are grown in accordance with this invention by a Czochralski technique from a molten mixture of constituent oxides in an inert atmosphere containing oxygen. Inclusion of oxygen in the inert atmosphere in concentration of from about 300 to about 9,000 PPM of oxygen resulted in substantial reduction in the density of light scattering defect sites and, thus, in substantial increase in the optical energy which may be applied to the crystal without causing substantial damage to the crystal in comparison to the crystals grown in an inert atmosphere containing less than 300 PPM, such as 200 PPM and less, of oxygen. By application of the growth atmosphere composition control, optical damage thresholds have been increased by more than an order of magnitude.

14 Claims, 2 Drawing Sheets

5,164,041

METHOD OF GROWING RARE EARTH DOPED ORTHOSILICATES(LN2-XREXSIO5)

This invention is concerned with rare earth doped rare earth orthosilicate crystals suitable for use in solid-state non-semiconductor lasers. The term "rare earth orthosilicate" encompasses orthosilicates of yttrium and lantanide series rare earth elements with atomic numbers 58–71 (Ce—Lu).

Solid-state non-semiconductor lasers have many uses in electrical and electronic industries, optical fiber communication, fine mechanics and aerospace sectors, as well as for many industrial uses such as for cutting, welding, drilling, surface treatment and other manufacturing technology where high optical output lasers are utilized. In view of this, there is continuing effort for finding new laser materials with the objective toward improving laser performance and expanding their operating wavelength range.

Among materials which seem promising are rare earth doped rare earth orthosilicates, $Ln_{2-x}RE_xSiO_5$, wherein Ln is selected from yttrium (Y) and Lantanide series rare earth elements with atomic numbers 58–71 (Ce—Lu), RE is at least one rare earth element of Lantanide series with atomic numbers 58 to 71 (Ce—Lu), said RE being an ion which is different from the Ln-ion in the said formula, and x is up to 0.3 (up to 15 at. % of total amount of the Ln and RE ions in the formula). One of these materials which is of particular interest as a laser medium is a Nd-doped yttrium orthosilicate ($Y_{2-x}Nd_xSiO_5$).

Yttrium orthosilicates are promising for use as an active media generating simulated emission in crystals irradiated at ($^4F_{3/2}$—$^4I_{9/2}$ transition), ($^4F_{3/2} \rightarrow ^4I_{11/2}$ transition) and ($^4F_{3/2} \rightarrow ^4I_{13/2}$ transition). For example, see Kh. S. Bagdassarov et al., "Laser properties of $Y_2SiO_5$—$Nd^{+3}$ crystals irradiated at $4F_{3/2} \rightarrow ^4I_{11/12}$ and $^4F_{3/2} \rightarrow ^4I_{13/2}$ transitions", Sov. Phys. Dokl. Vol. 18, No. 10, April 1974, p. 664; A. M. Morozov et al., "Luminescence and Stimulated Emission of Holmium in -Yttrium-and - erbium-oxyortho-silicate Single Crystals", Opt. Spectrosc.(USSR), Vol. 41, No. 6, December 1976, pp. 641–642; A. M. Tkachuk et al., "$Nd^{+3}$ Optical centers in lutecium, yttrium and scandium silicate crystals and their spontaneous and stimulated emission", Opt. Spectrosc. (USSR), 60 (2), February 1986, pp. 176–181; and R. Beach et al., "A Ground State Depleted Laser in Neodymium Doped Yttrium Orthosilicate" presented at SPIE/OE/LASE 1990 on Jan. 16, 1990.

The rare earth orthosilicate ($Ln_{2-x}RE_xSiO_5$) crystals are grown typically by the Czochralski method by pulling a crystal from the melt containing $SiO_2$ and ($Ln_2O_3$ with up to 15 at. % of rare earth (RE) dopants) in the stoichiometric ratio of 1:1 of $SiO_2$ to ($Ln_2O_3$ and $RE_2O_3$). The Czochralski's method is a well-known technique for growing crystals by pulling a crystal seed from a melt having a desired composition. Czochralski's method is described in a book by R. A. Laudise entitled "The Growth of Single Crystals", 1970, Prentice-Hall, Inc., Englewood Cliffs, N.J., Chapter 5, pages 174–196; and in Brandle, C. D. et al, "Czochralski Growth of Rare-Earth Orthosilicates ($Ln_2SiO_5$)", Journal of Crystal Growth, 79 (1986), pp. 308–315, North Holland, Amsterdam. The orthosilicate crystals are grown by pulling from thick-walled iridium crucibles with careful thermal shielding of the crucible and of the growing crystal in an inert atmosphere in an apparatus having induction heating. Unfortunately, it was discovered that the crystals exhibited pronounced light scattering defects.

The purpose of this invention is to grow rare earth doped rare earth orthosilicate crystals in which the light scattering defects are substantially absent.

SUMMARY OF THE INVENTION

The invention is a technique for the growth of single crystals of rare earth doped rare-earth orthosilicate crystals which may be used as the laser medium in solid-state non-semiconductor lasers. This type of laser has applications in electronics, communications, aerospace systems, and manufacturing technology where high optical output lasers are utilized. Of particular interest is the $Y_{2-x}Nd_xSiO_5$ crystal, with x being up to 0.3, which may be efficiently pumped by a semiconductor laser, solid state non-semiconductor laser, a flashlamp or some other source of light radiation, and has been found to be operable at very high optical output.

The rare-earth orthosilicate crystals are grown in accordance with this invention by a Czochralski technique from a molten mixture of constituent oxides in an inert atmosphere containing oxygen. Inclusion of oxygen in the inert atmosphere in concentration of from about 300 to about 9,000 PPM of oxygen resulted in substantial reduction in the density of light scattering defect sites and, thus, in substantial increase in the optical energy which may be applied to the crystal without causing substantial damage to the crystal in comparison to the crystals grown in an inert atmosphere containing less than 300 PPM, such as 200 PPM and less, of oxygen. Absorption of energy from the high optical flux present during the laser operation at these defect sites results in further degradation of the laser crystal. Through selection of the $O_2$ concentration in the atmosphere in which the crystal growth is performed, the density of defects which produce light scattering has been significantly reduced. By application of the growth atmosphere composition control, optical damage thresholds have been increased by more than an order of magnitude.

DETAILED DESCRIPTION

The present invention is a method of growing crystals of rare-earth doped rare-earth orthosilicates for use in solid-state non-semiconductor lasers. The orthosilicates of interest have a general formula $Ln_{2-x}RE_xSiO_5$, wherein Ln is at least one element selected from yttrium (Y) and Lantanide series rare earth elements with atomic numbers 58 to 71 (Ce—Lu), RE is at least one rare earth element of Lantanide series with atomic numbers 58 to 71 (Ce—Lu) with RE-ion being different from Ln-ion in the formula, and x is up to 0.3. In accordance with the invention the crystals are grown from a melt by the Czochralski method under such conditions as to eliminate or at least reduce substantially light scattering defect sites in the grown crystals.

Figure 1:
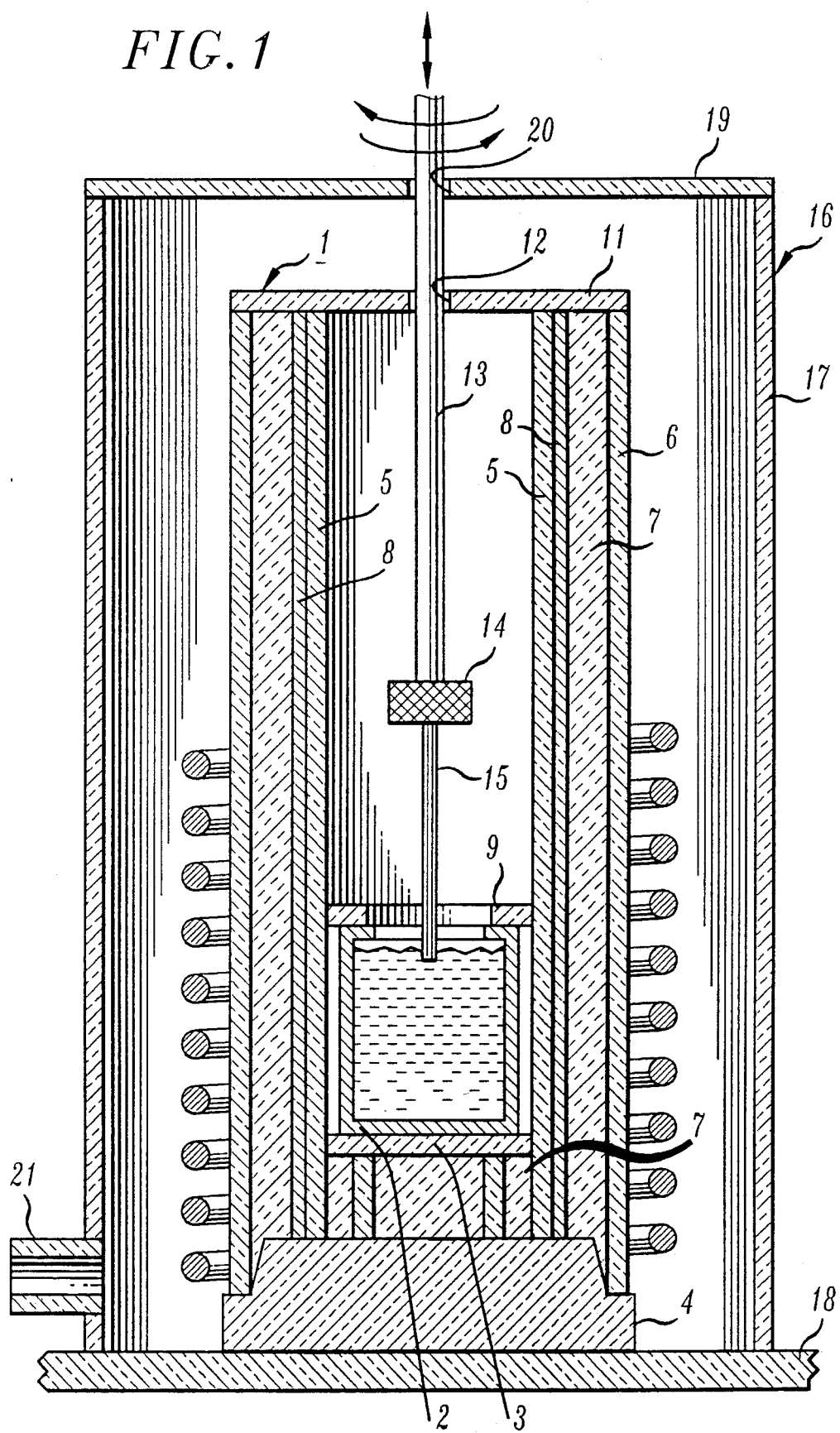
FIG. 1 is a schematic diagram of an apparatus for growing crystals of rare-earth doped orthosilicates in accordance with this invention.

An exemplary furnace used for growing $Ln_{2-x}RE_x$-$SiO_5$ crystals is shown schematically in FIG. 1. The furnace, 1, includes an iridium crucible, 2, upon a $ZrO_2$ support, 3, in turn positioned upon a $ZrO_2$ base, 4. The crucible is enclosed within an inner $ZrO_2$ tube, 5, and an outer quartz tube, 6, of greater diameter than the inner tube. The tubes also rest on $ZrO_2$ base 4. The space between the tubes, as well as the space between support 3 and the base may be filled with suitable insulation, such as granular $ZrO_2$ insulation, 7. Additionally, a $ZrO_2$ felt, 8, may be positioned on that wall of the inner tube which faces the outer tube. A small ceramic ring, 9, rests on top of crucible 2 to reduce the thermal losses of the crucible and, therefore, the danger of a possible failure of the crucible. A doughnut type lid, 11, with a centrally located hole, 12, for passage of a crystal pulling shaft, 13, rests on top of the furnace. Shaft 13 is movable vertically and is rotatable about its longitudinal axis in a known manner. Shaft 13 is provided with a collet, 14, for securing an iridium rod, 15, to the shaft. Initial crystalline growth may be started on the iridium rod, with crystalline material becoming a single crystal quickly after the initiation of the growth. Alternatively, a seed crystal of a desired composition and orientation may be secured on the shaft or on the iridium rod.

Furnace 1 is enclosed within an enclosure, 16, which includes a jacket tube, 17, which rests upon a base plate, 18. A doughnut type lid, 19, with a centrally located hole, 20, for the passage of shaft 13 rests on top of jacket tube 17. An inlet, 21, is provided for passage of gasses needed for maintaining a suitable atmosphere within enclosure 16 and furnace 1.

For crystal growth, oxide powders with a minimum purity of 99.999% or higher, are used for both the rare-earth oxides ($Ln_2O_3$ and $RE_2O_3$), and $SiO_2$. Rare earth dopants (RE), selected from Ce, Pr, Nd, Sm, Gd, Tb, Er, Tm and Yb, may be introduced into the powders in concentrations of up to 15 at. % of the total amount of the Ln and RE oxides. For those applications where the laser may be pumped with high flux density coherent light, the RE dopants are preferably included in the range of from 0.0001 to 0.2 moles (0.005 to 10 at. % of the Ln and RE components). The oxide powders are fired at 1100° for 2-8 hours prior to the use in the crystal growth process to insure that the powders are free from moisture and $CO_2$. The fired oxide powders are then weighed and mixed in a 1:1 stoichiometric ratio of $(Ln_{2-x}RE_xO_3):SiO_2$, isostatically pressed into a cylinder and loaded into the crucible. While the powders may be loaded into the crucible in a loose form, the compressed form enables placing a greater quantity of powder into the crucible. The RE component may be also added in the form of orthosilicates rather than oxides either to the oxide powders or to the melt.

In the exemplary embodiment, crucible 11, used for growing exemplary $Y_{2-x}Nd_xSiO_5$ crystals, was a 5 cm. diameter x 5 cm high iridium crucible, which was filled to within 7 mm of the top with a typical charge of 280 g. The crystals were grown from a melt with liquid surface temperature of about 2070° C., with shaft rotation rate of from 10 to 60 RPM and with pull rate of from 0.25 to 4.0 mm/hr. Typically, the crystals were grown in an inert atmosphere under atmospheric pressure. Typical $Y_{2-x}Nd_xSiO_5$ crystals grown from the 5×5 cm crucible weighed from 100 to 120 g and were approximately from 1.5 to 2.5, typically 2 cm. in diameter and from 8 to 12, typically about 10 cm long. The crystals show no tendency to "wander" from the original seed orientation and may be grown along any direction. In the exemplary embodiment the crystals were grown at 20° from <010> direction.

It has been discovered that crystals grown in an inert atmosphere, when exposed to illumination by energy with high flux density most conveniently along their longitudinal axis, exhibited pronounced light scattering characteristic. This characteristic is highly undesirable in a laser medium. When a crystal containing light scattering sites is subjected to high intensity pumping light, such as coherent radiation, light scattering produces physical damage within the crystal, due to energy absorption at these scattering sites. The rapid heating due to this absorption, in turn, produces more damage in the region of the scattering sites. As the size and density of these defects increase, output of the laser light from the laser medium decreases or the conditions required for laser emission will not be achieved. This leads to a laser medium with internal scattering and reduced or no coherency of radiation in the emitted light.

This problem has been solved in accordance with this invention by including oxygen into the inert atmosphere maintained above the melt and surrounding the crystal being pulled from the melt. The inert atmosphere typically is that of at least one of argon, helium, nitrogen and other gases which do not react with the crystal, its components and the materials of the crucible and the furnace. Carbon dioxide ($CO_2$) may also form at least a part of the inert atmosphere. Carbon dioxide initially decomposes into carbon monoxide (CO) and oxygen ($O_2$). Upon reaching an equilibrium, the atmosphere will contain $CO_2$, CO and $O_2$. In this manner, carbon dioxide may be used to control the concentration of oxygen in the inert atmosphere.

The oxygen is included in the inert atmosphere in an amount sufficient to yield partial pressure of oxygen in a concentration ranging from 300 to 9000 ppm, preferably from 400 to 7000 ppm, most preferably from 500 to 5000 ppm. No scattering is observed in crystals grown within an atmosphere containing oxygen in the concentration range of from 500 to 5000 ppm. Below 300 ppm concentration of $O_2$ in the inert atmosphere, light scattering is observed in the $Y_{2-x}RE_xSiO_5$ crystals, which increases with decreasing concentration of oxygen. At concentration above 9000 ppm, such as 10,000 ppm and higher, some light scattering is noted again. It is believed that the latter scattering is the result of inclusions of Ir in the crystals due to reaction of Ir crucible with $O_2$ at such higher $O_2$ concentrations. This is consistent with an observation of the presence of Ir particles on the exterior surface of the crystal after growth in an atmosphere with oxygen concentration of 10,000 ppm or higher.

Figure 2:
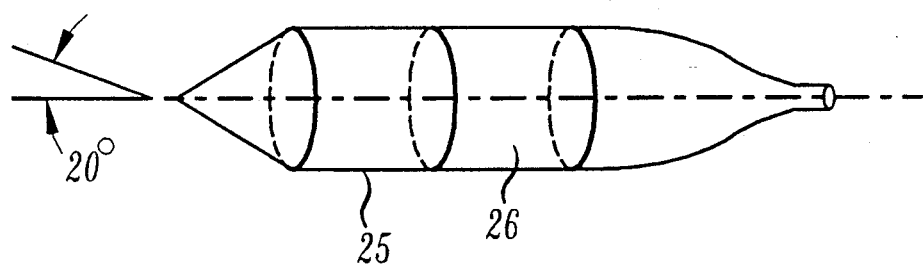
FIG. 2 is a schematic representation of a crystal rod grown in the apparatus of FIG. 1.

Crystals were grown in the above-described apparatus and under above described conditions at atmospheric pressures having varied partial pressures of oxygen in an inert gas. Typically, nitrogen was used as the inert gas. A schematic representation of a crystal rod, 25, grown under such conditions is shown in FIG. 2. At least one portion of the crystal rod, such as section 26, was then excised for use in a laser device.

Portions of crystal rods, such as section 26 of crystal 25 in FIG. 2, grown in an inert atmosphere with different concentrations of $O_2$ were excised and subjected to coherent radiation in an oscillating laser cavity of the type described hereinbelow with reference to FIG. 3.

On basis of these tests it was determined that the crystals grown in an inert atmosphere with oxygen content of less than 300 ppm, such as less than 200 ppm, underwent internal damage when subjected to low quantities of optical energy, while those grown in the inert atmosphere with higher concentration of oxygen required much higher quantities of optical energy for a similar damage extent. This is represented hereinbelow as follows:

| PPM of $O_2$ | Optical damage Threshold (J/cm2) |
|---|---|
| <200 | 2-5 |
| 500-5000 | 40 |
| 10,000 | <40 |

In the preferred embodiment, the crystal is an yttrium orthosilicate doped with neodymium and having formula $Y_{2-x}Nd_xSiO_5$, wherein x is from 0.0001 to 0.2 moles, preferably from 0.007 to 0.02 moles. The growth of a $Y_{2-x}Nd_xSiO_5$ crystal with a mean x=0.011(or $1.1 \times 10^{20}$ Nd atoms/cm$^3$) was performed from a melt containing 217.26 gm of $Y_2O_3$, 4.18 gm of $Nd_2O_3$, and 58.56 gm of $SiO_2$. Czochralski growth conditions were a liquid surface temperature of 2070° C., rotation rate of 40 RPM, pull rate of 0.75 mm/hr, and [$O_2$] of 1200 PPM in nitrogen. The crystal withstood damage when irradiated with optical energy of greater than 40J/cm$^2$.

Figure 3:
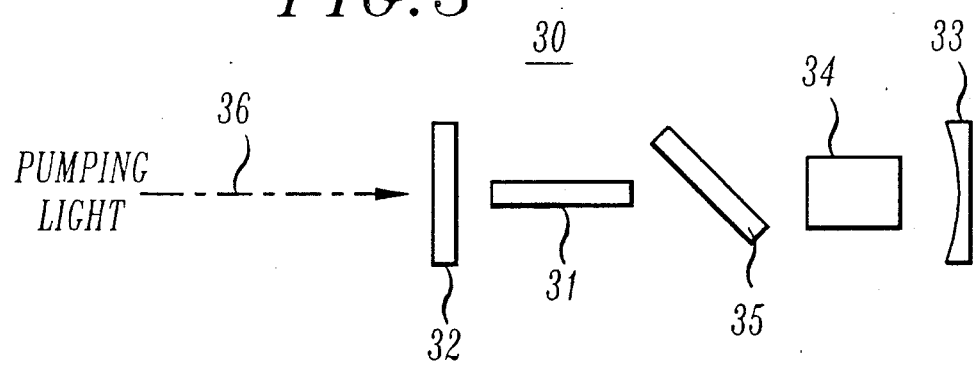
FIG. 3 is a schematic diagram of a ground state depleted oscillating laser cavity using a section of the crystal excised from the crystal rod of FIG. 2.

A schematic diagram of an exemplary oscillating non-semiconductor laser cavity, 30, is shown in FIG. 3. This cavity, when pumped by coherent light of one wavelength ranging from 700 to 850 nm, such as 745 nm, may operate at another higher frequency ranging from 911 to 919, such as 912 nm. Schematically, the oscillating laser cavity includes a crystalline laser rod, 31, of Nd$^3$: $Y_2SiO_5$, a pair of dielectric mirrors, 32 and 33, a frequency modifier, 34 and a selective absorber, 35. In the example, the oscillating cavity was 100 cm long, and the laser rod was Nd$^3$: $Y_2SiO_5$ crystal 7.1 cm long doped with Nd$^3$ at $0.9 \times 10^{19}$cm$^{-3}$. Flat dielectric mirror 32, with high reflectance, greater than 99% for 912 nm laser wavelength and transmissivity of about 70% for 745 nm laser wavelength, is well suited for transmission of high intensity coherent light (indicated by an arrow, 36) pumped at 745 nm. The concave dielectric mirror 33, with reflectance at 912 nm and from 70 to 80% reflectivity, is used as the reflective mirror. A KDP Rochelle cell positioned between absorber 35 and mirror 33 acts as frequency modifier 34, e.g. to double the frequency of the pumping light pumped at 745 nm into the cavity from a suitable source (not shown) of coherent light. Absorber 35, a samarium scandium gallium garnet inserted into the cavity at Brewsters angle, is used to suppress considerable Nd$^{3+}$ $^4F_{3/2}$—$^4I_{11/12}$ transition gain. A more detailed description of a ground state depleted laser is presented in the article by R. Beach et al., supra.

Figure 4:
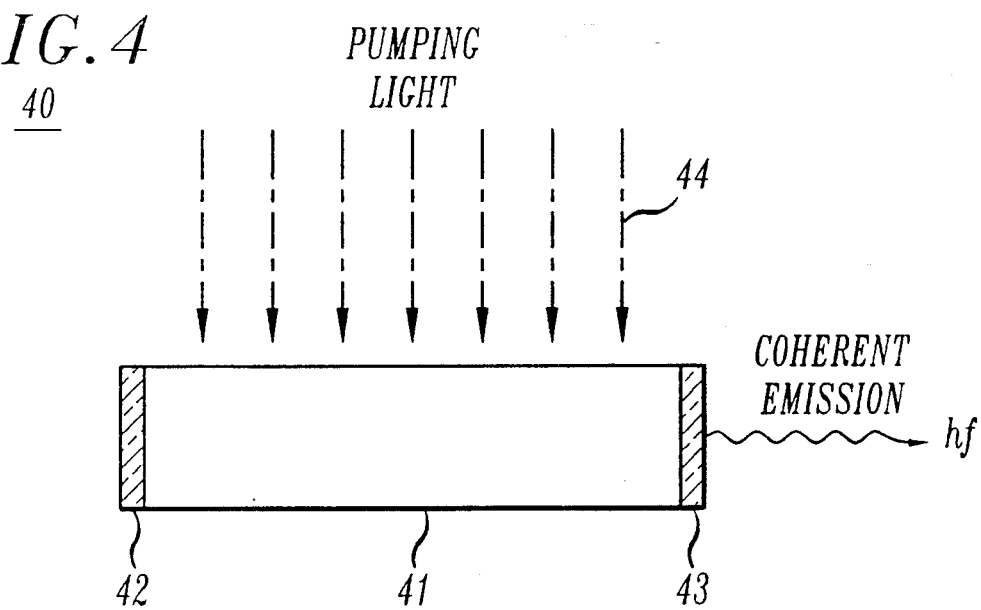
FIG. 4 is a schematic diagram of a laser using a section of a crystal rod of FIG. 2 suitable for use as a light source in optical fiber communication.

In FIG. 4 is shown a schematic diagram of another exemplary laser of Ln orthosilicate doped with a select RE. Schematically, the laser, designated generally 40, includes crystalline laser rod, 41, dielectric mirrors, 42 and 43, at each end of the laser rod and a suitable source (not shown) of a pumping light which is represented by arrows, 44. Coherent emission may take place through either one or both of mirrors 42 and 43, depending on the reflectivity and transmissivity of each mirror. A source of the pumping light may be another laser or a flashlight or an LED (or an array of LEDs) providing pumping light with wavelengths within a range of from 0.70 to 0.85 μm, such as 0.75 and 0.81 μm. Alternatively, the pumping light may be injected through one of the mirrors. In such an instance, a suitable transparent coupling material (not shown) may be inserted between the source (not shown) of the pumping light and the mirror.

We claim:

1. A method of growing a body of crystalline material for use in a solid-state non-semiconductor laser, said body of crystalline material consisting essentially of rare earth doped rare earth orthosilicate having general formula $Ln_{2-x}RE_xSiO_5$ wherein Ln is at least one of Y and Lantanide series rare earth elements with atomic numbers 58-71 (Ce—Lu), RE is at least one rare earth ion of Lantanide series with atomic numbers 58 to 71 (Ce—Lu), wherein said RE-ion is different from said Ln-ion in the formula, and x is up to 0.3 moles, said method comprising
   a) preparing in an iridium crucible a melt consisting essentially of oxides of Ln, oxides of RE, and $SiO_2$, in amounts to result in said general formula $Ln_{2-x}RE_xSiO_5$,
   b) growing a crystal from said melt by pulling the crystal from the melt, and
   c) maintaining an inert gas atmosphere above the melt and surrounding the crystal being grown,
   CHARACTERIZED BY
   including into said inert gas atmosphere from 300 to 9000 ppm of oxygen.

2. The method of claim 1, in which said atmosphere contains from 400 to 7000 ppm of oxygen.

3. The method of claim 1, in which said atmosphere contains from 500 to 5000 ppm of oxygen.

4. The method of claim 1, in which said RE is selected from Ce, Pr, Nd, Sm, Gd, Tb, Er, Tm and Yb.

5. The method of claim 1, in which said crystal is $Y_{2-x}RE_xSiO_5$.

6. The method of claim 5, in which said RE is selected from Ce, Pr, Nd, Sm, Gd, Tb, Er, Tm and Yb.

7. The method of claim 5, in which said RE is Nd.

8. The method of claim 7, in which said x is from 0.0001 to 0.2 moles.

9. The method of claim 1, in which Ln is Y, RE is Nd and x is from 0.0001 to 0.2 moles.

10. The method of claim 1, in which said growth is conducted at atmospheric pressure.

11. The method of claim 1, in which said inert gas is selected from the group consisting of argon, helium and nitrogen.

12. The method of claim 11, in which said inert gas is nitrogen.

13. The method of claim 11, in which said inert gas includes $CO_2$.

14. The method of claim 1, in which a section of the grown crystal is excised perpendicular to its central axis for use in the laser.

* * * * *